(12) United States Patent
Suh et al.

(10) Patent No.: US 7,579,653 B2
(45) Date of Patent: Aug. 25, 2009

(54) TFT, ELECTRONIC DEVICE HAVING THE TFT, AND FLAT DISPLAY DEVICE HAVING THE TFT

(75) Inventors: Min-Chul Suh, Suwon-si (KR); Jae-Bon Koo, Suwon-si (KR); Hye-Dong Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 512 days.

(21) Appl. No.: 11/184,829

(22) Filed: Jul. 20, 2005

(65) Prior Publication Data

US 2006/0017106 A1  Jan. 26, 2006

(30) Foreign Application Priority Data

Jul. 21, 2004  (KR) .................. 10-2004-0056820

(51) Int. Cl.
*H01L 21/00* (2006.01)
(52) U.S. Cl. .............. 257/347; 257/E29.151; 257/E51.005; 438/151
(58) Field of Classification Search ........ 257/347, 257/E51.005, E29.151; 438/151
See application file for complete search history.

(56) References Cited

U.S. PATENT DOCUMENTS 5,500,545 A   3/1996   Cheng et al.

2003/0141504 A1*  7/2003  Kuwabara et al. .......... 257/66
2004/0112964 A1*  6/2004  Empedocles et al. ....... 235/491

FOREIGN PATENT DOCUMENTS

| JP | 05-206422 | 8/1993 |
|----|-----------|--------|
| JP | 2002-359251 | 12/2002 |
| JP | 2003-017508 | 1/2003 |
| JP | 2003-152191 | 5/2003 |
| JP | 2004-048062 | 2/2004 |
| KR | 1998-018417 | 3/1999 |

OTHER PUBLICATIONS

Chinese Office Action dated Aug. 1, 2008.

* cited by examiner

*Primary Examiner*—Sue Purvis
*Assistant Examiner*—Tucker Wright
(74) *Attorney, Agent, or Firm*—H.C. Park & Associates, PLC

(57) ABSTRACT

The invention provides an improved thin film transistor (TFT) that can be formed at room temperature and has an improved contact resistance between an active layer and source and drain electrodes, and further provides a flat display device using such a TFT. The TFT includes an active layer including at least two nano particle layers which include at least one nano particle type, an insulating layer interposed between the nano particle layers, a gate electrode insulated from the active layer, and source and drain electrodes formed in respective channels, the source and drain electrodes contact one of the nano particle layers of the active layer. The structure of the TFT facilitates the simultaneous manufacturing of a plurality of different types of TFTs.

35 Claims, 10 Drawing Sheets

TFT, ELECTRONIC DEVICE HAVING THE TFT, AND FLAT DISPLAY DEVICE HAVING THE TFT

CROSS-REFERENCE TO RELATED APPLICATION

This application claims the priority of Korean Patent Application No. 10-2004-0056820, filed on Jul. 21, 2004, in the Korean Intellectual Property Office, the disclosure of which is incorporated by reference in its entirety herein.

BACKGROUND OF THE INVENTION

1. Field of the Invention

The present invention relates to a thin film transistor (TFT) and an electronic flat display device having the same, and, in particular, a thin film transistor and an electronic display device including nano particles in at least a channel.

2. Description of the Related Art

Organic electroluminescent display (OELD) devices can be classified as either passive matrix (PM), which uses a manual driving method, or active matrix (AM), which uses an active driving method.

In a PM OELD device, pixels are formed by anode electrodes and cathode electrodes arranged in columns and rows, respectively, whereby scanning signals are supplied to the cathodes from a row driving circuit. Only one row at a time, however, is selected from the plurality of cathode rows. Data signals are subsequently applied to the anodes from a column driving circuit to display an image.

In contrast, an AM OELD device controls individual pixels with control signals using a thin film transistor (TFT) and is widely used for displaying moving images since it is more suitable for processing a large number of signals.

A TFT of an AM flat display device includes a source region, a drain region, a semiconductor active layer having a channel region between the source and drain regions, a gate electrode insulated from the channel region, and source and drain electrodes.

The semiconductor active layer is conventionally formed of amorphous silicon or polysilicon. However, polysilicon has been more prevalent because amorphous silicon has poor electrical characteristics and low electrical reliability. The current mobility value of polysilicon can be as high as the hundreds of $cm^2/Vs$, and polysilicon has good electrical characteristics, such as a low leakage current and high reliability.

However, a polysilicon is formed when crystallizing amorphous silicon by means of a crystallizing process that uses high temperatures exceeding 300° C.

Recently, flat display devices have become flexible so that they can be bent a certain amount when a predetermined tension is applied to secure a sufficient viewing angle. Thus, these flexible flat display devices have been used in portable products such as, for example, arm bands, purses, and notebook computers.

Nevertheless, it is difficult to obtain a flexible flat display device when using crystallized polysilicon TFTs formed by a method similar to the one described above. As a result, to form a flexible product, most of the display components, including the substrate, should be formed of a flexible material such as acryl, polyimide, polycarbonate, polyester, mylar, or plastic. But these materials, however, do not have high heat resistance.

Accordingly, for manufacturing polysilicon TFTs to be employed in a flexible flat display device, it is necessary to find a TFT structure that can be formed below a temperature at which the plastic can be processed.

A method for fabricating a TFT for use in a flexible product that includes a channel formed with a nano structure is described in Japanese Published Application 2004-048062.

SUMMARY OF THE INVENTION

The present invention provides an improved TFT and a flat display device having such an improved TFT. The structure of the TFT facilitates the simultaneous formation of many different types of TFTs.

The present invention discloses a TFT, including: an active layer having at least two nano particle layers, each of which include at least one nano particle type; an insulating layer interposed between two nano particle layers; a gate electrode insulated from the active layer; and source and drain electrodes formed in respective channels. The source and drain electrodes contact one of the nano particle layers of the active layer.

The present invention also discloses an electronic device including two different kinds of TFTs electrically connected to each other. Each of the TFTs include: an active layer including at least two nano particle layers, each layer having at least one nano particle; an insulating layer interposed between two active layers disposed in the TFTs; a gate electrode insulated from the active layer; and source and drain electrodes contacting one nano particle layer of the active layer.

The present invention provides a flat display device including: a substrate; and an emissive region having a plurality of pixels disposed on the substrate, each pixel including a plurality of selection driving circuits. Each of the selection driving circuit includes at least one TFT comprising: an active layer including at least two nano particle layers that each include at least one nano particle type; an insulating layer interposed between two nano particle layers; a gate electrode insulated from the active layer; and source and drain electrodes contacting one of the nano particle layers of the active layer.

The present invention further provides a flat display device including: a substrate; and an emissive region having a plurality of pixels disposed on the substrate, each pixel comprising a plurality of selection driving circuits. Each of the selection driving circuits includes at least two different kinds of TFTs, each of which includes: an active layer including a nano particle layer that includes at least one type of nano particle; a gate electrode insulated from the active layer; and source and drain electrodes contacting the nano particle layer of the active layer, wherein an insulating layer is interposed between the active layers of the TFTs of each of the selection driving circuits.

BRIEF DESCRIPTION OF THE DRAWINGS

The features and advantages of the present invention will become more apparent by describing in detail embodiments thereof with reference to the attached drawings.

DETAILED DESCRIPTION OF THE INVENTION

Figure 1:
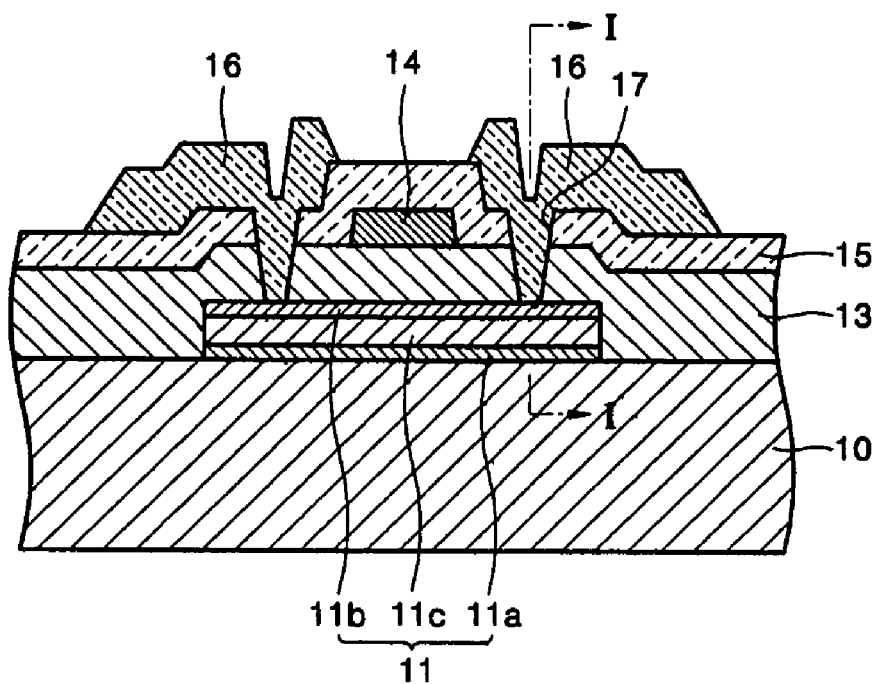
FIG. 1 is a cross-sectional view of a TFT according to an embodiment of the present invention.

The present invention will now be described more fully with reference to the accompanying drawings in which embodiments of the invention are shown.

In the drawings, the thickness of layers and regions are exaggerated for clarity. It will be understood that when an element such as a layer, film, region or substrate is referred to as being "on" another element, it can be directly on the other element or intervening elements may also be present. In contrast, when an element is referred to as being "directly on" another element, there are no intervening elements present. Like numbers refer to like elements throughout the specification.

Referring to FIG. 1, the TFT is formed on a substrate 10. Substrate 10 may be formed from acryl, polyimide, polycarbonate, polyester, mylar, or plastic, but it is not limited to these materials and can be formed, for example, from a glass material. If necessary, a buffer layer for preventing the diffusion of dopant ions and a barrier layer for preventing the penetration of moisture or air may also be formed on substrate 10.

The TFT includes an active layer 11, a gate electrode 14 insulated from the active layer 11, and source and drain electrodes 16 contacting active layer 11.

Active layer 11 may be formed in a predetermined pattern on substrate 10 and then a gate insulating film 13 covering active layer 11 can be formed. Gate electrode 14 may be formed on gate insulating film 13 and then an interlayer insulating layer 15 covering gate electrode 14 can be formed. A contact hole 17 may then be formed in gate insulating film 13 and interlayer insulating layer 15. Source and drain electrodes 16 can be formed on interlayer insulating layer 15 and connected to the active layer 11. This TFT structure is not limited to the structure described above, and a variety of TFT structures can be implemented in the present invention.

Figure 2:
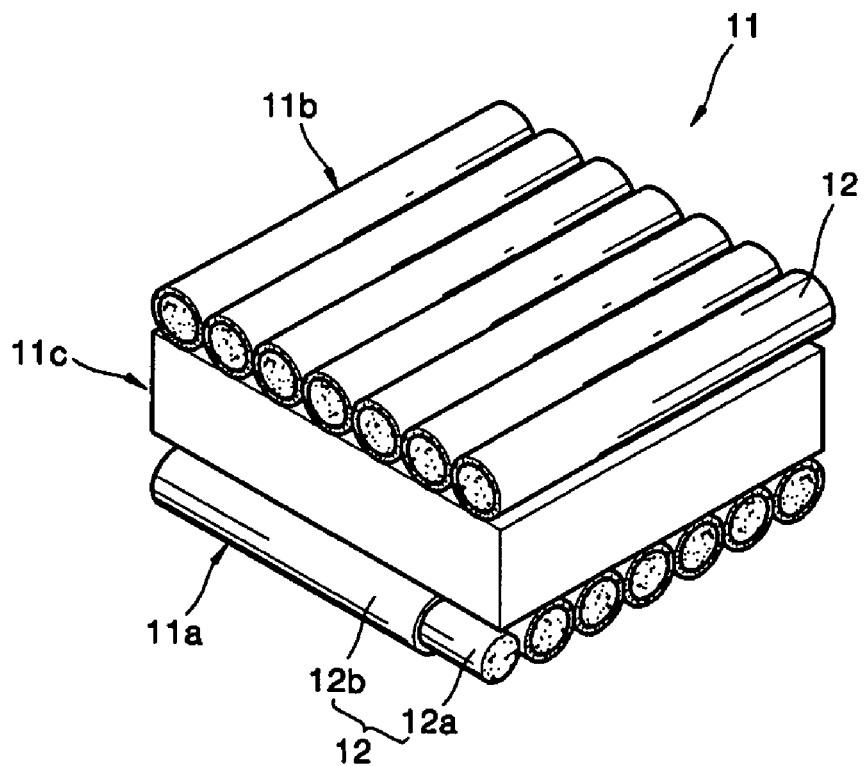
FIG. 2 is a partial perspective view of an active layer of FIG. 1.

As shown in FIG. 2, active layer 11 can include at least two nano particle layers 11a and 11b, each of which includes at least one nano particle 12, and an insulating layer 11c interposed between nano particle layers 11a and 11b. Here, first and second nano particle layers 11a and 11b each have a plurality of nano particles 12 arranged in parallel. Other nano particle layers, however, may also be included.

Nano particles 12 may be formed of: a IIB-VIA group compound that includes CdS, CdSe, and CdTe; a IIIA-VA group compound that includes GaAs; a IVA group element or compound that includes Si; or a metal or compound from a group that includes Ni, Co, Fe, Pt, Au, and Ag. The nano particles 12 are not limited to the compounds and elements listed above, and can be formed of a variety of suitable materials.

Nano particles 12 can be formed using either physical or chemical method before the TFT is formed. Some examples of methods of forming nano particles 12 will now be described.

In a chemical method, nano particles 12 may include a core formed of one of the nano particle compounds listed above. The nano particles 12 may further include one of these compounds coated on the core.

For example, the first step for forming a CdSeZnS nano particle is preparing a CdSe nano crystal. It is known that the size of this nano particle is approximately 23-55 Å and the standard deviation of size distribution among the particles is approximately 5-10%. This CdSe nano particle may be formed through a colloidal growth process at a high temperature and may be accompanied by a precipitation process for regulating particle size. In the colloidal growth process, homogenous nuclei are instantly generated by rapidly injecting organic metal precursors into a high temperature solvent. The organic metal precursor used as a Cd source includes a Cd compound, such as $CdMe_2$. An organic compound used as a Se source may be a trialkylphospnine selenide, such as $(TMS)_2Se$, TOPSe, or TBPSe. Next, the CdSe particles are coated with a solution containing Zn and S precursors in a solvent, such as TOP, at an appropriate temperature. The Zn and S precursors can be diethylzinc and hexamethyldisilaztine, respectively.

The physical method used to form nano particles 12 may be vacuum synthesis, gas-phase synthesis, condensed phase synthesis, high speed deposition by an ionized cluster beam, consolidation, milling, mixalloy processing, a deposition method, or a Sol-Gel method, as well as any other suitable physical method.

Nano particle 12 may be a P-type or an N-type semiconductor and can be formed in a variety of shapes, such as a nano wire, a nano ribbon, a nano rod, and a nano tube including a single wall layer or a plurality of wall layers.

Detailed examples of methods of forming the nano particles 12 will now be described.

A P-type Si nano wire having a thickness of 20-40 nm can be synthesized by thermal deposition of $SiH_4$ and $B_2H_6$ in a reactor using a commercially available mono dispersed gold colloid particle (British Biocell International Ltd). The reaction temperature is 420-480° C. and the reactor includes an 8-inch tube furnace in which the particle growth can be computer controlled. The reaction takes about 40 minutes when the total pressure is approximately 30 torr and the partial pressure of silane is approximately 2 torr. The ratio of $SiH_4$ to $B_2H_6$ is maintained at 6400:1 in consideration of a doping level. The doping concentration of nano wire can be approximately $4\times10E+17$ $cm^{-3}$. The higher the doping level, the lower the contact resistance, even though a high temperature annealing process is not used.

An N-type Si nano wire is synthesized using a laser-assisted catalytic growth (LCG) technique. In brief, a method of ablating a gold target using an Nd:YAG laser (532 nm; 8 ns pulse width, 300 mJ/pulse, 10 Hz) is performed. The generated gold nanocluster catalytic particles are grown into Si nano wires by reacting with $SiH_4$ gas in a reactor. When doping the N-type Si nano wire, the dopant is generated by placing a Au—P target (99.5:0.5 wt %, Alfa Aesar) and an additional red phosphorus (99% Alfa Aesar) at an inlet of the reactor.

An N-type GaN nano wire may be synthesized by forming an ammonia gas (99.99%, Matheson), a Ga metal (99.9999%, Alfa Aesar), and $Mg_3N_2$ (99.6%, Alfa Aesar) to a metal-catalyzed chemical vapor deposition (CVD) target using N, Ga, and Mg, respectively. A substrate can be formed of c-plane sapphire. The $MgN_2(s)$ thermally decomposes according to $MgN_2(s) \rightarrow 3Mg(g)+N2(g)$, and generates an Mg dopant that is placed upstream from a Ga source. The nano wire is formed at a temperature of 950° C., and nickel is used as a catalyst. The resulting Ga nano wires have a length distribution of approximately 10-40 μm.

An N-type CdS nano ribbon is synthesized by a vacuum capour transport method. A small amount of CdS powder, approximately 100 mg, is placed on an end of the vacuum capour transport, which is then sealed. While heating one end of the vacuum capour transport to maintain the CdS powder at a temperature of 900° C., the other end of the vacuum capour transport is maintained at a temperature lower than 50° C. The CdS powder is moved to the cold end of the vacuum capour transport after two hours and sticks on the wall of the vacuum capour transport. The resulting material are nano ribbons having a thickness of approximately 30-150 nm. The width of the nano ribbons is about 0.5-5 μm and their length is about 10-200 nm.

Ge nano wires are formed by performing CVD for 15 minutes at a temperature of 275° C. in a furnace reactor (total pressure=1 atm) having a diameter of 2.5 cm by allowing $H_2$ to flow at 100 sccm while maintaining the flowrate of $GeH_4$ (10% in He) at 10 sccm. A $SiO_2$ substrate is used on which Au nano crystals having an average diameter of 20 nm are uniformly distributed is used.

InP nano wires are formed using an LCG method. An LCG target can be composed of 94% InP, 5% Au as a catalyst, and 1% Te or Zn as a dopant. The target is placed in an upstream end of the furnace, which is maintained at a temperature of approximately 800° C. while growing the wires. An Nd—YAG laser (1064 nm wavelength) is irradiated for 10 minutes, and the nano wires are then collected in the cold downstream end of the furnace (NATURE, 409, 66-69 (2001)).

ZnO nanorods are formed by adding 65 mL of ethanol, in which 14.8 g (0.23 mol) of potassium hydroxide (KOH) is dissolved, to 125 mL of methanol, in which approximately 29.5 g (0.13 mol) of Zinc acetate dihydrate ($ZnOCOCH_3$—$2H_2O$) is dissolved, at a temperature of 60° C. The reactants are stirred for a few days at 60° C. The precipitates are washed with methanol and centrifugally separated at 5500 rpm for 30 minutes. The obtained nano particles are diluted in a solvent of ethylene glycol:water at an approximate ratio of 2:1. After maturing for about 3 days, nano rods having a diameter of about 15-30 nm and a length of approximately 200-300 nm can be obtained. Besides the above-described method, nano wires can also be formed using a CVD method (NANO LETTERS, 3(8), 1097-1101(2003)).

First and second nano particle layers 11a and 11b can be arranged having their nano particles 12 perpendicular to each other (as shown in FIG. 2) or parallel to each other (not shown).

A channel is formed in one of first and second nano particle layers 11a and 11b and can be extended parallel to the direction in which nano particles 12 extend. When the channel is formed parallel to nano particles 12, the mobility characteristic of the TFT can be further increased since the resistance against carriers that move along the channel is reduced.

Accordingly, in the present invention, a channel having desired mobility characteristics is obtained by forming the nano particle layers such that the nano particle layers are arranged in different directions.

In this structure, the nano particle layers can be composed of different nano particles. That is, one nano particle layer can be formed of P-type nano particles and another nano particle layer can be formed of N-type particles. In this case, a P-type TFT, an N-type TFT, or a complementary metal-oxide semiconductor (CMOS) TFT can be easily formed by controlling the location, i.e., a depth of a contact hole of source and drain electrodes 16.

Referring to FIG. 2, an embodiment of the present invention includes an active layer 11 has a structure in which a first nano particle layer 11a, an insulating layer 11c, and a second nano particle layer 11b are sequentially formed. First nano particle layer 11a and second nano particle layer 11b can be formed of different kinds of nano particles. For example, first nano particle layer 11a can be formed of P-type nano particles and second nano particle layer 11b can be formed of N-type nano particles. However, the active layer is not limited as such. That is, the nano particle layers can be formed of nano particles having different mobility characteristics.

Nano particles 12 can be formed on a substrate using a variety of methods, such as, for example, a stamping method using a polymer mold or a laser transcription method using a donor sheet in which the nano particles are arranged in one direction. Moreover, an ink-jet printing method can also be used.

First nano particle layer 11a, the nano particles of which are arranged in one direction, may be formed on substrate 10, and insulating layer 11c covering the first nano particle layer 11a may be subsequently formed. Second nano particle layer 11b can be formed on insulating layer 11c. Afterward, first nano particle layer 11a, second nano particle layer 11b, and insulating layer 11c are simultaneously patterned to form an active layer 11 having a desired pattern.

Referring to FIG. 2, typically the nano particles 12 include a core unit 12a surrounded by an oxide film 12b, and, for example, if the core unit 12a has a diameter of 30 nm, then oxide film 12b has a thickness of approximately 1-10 nm. This kind of structure is observed in nano particles containing silicon.

However, when active layer 11 includes nano particles 12 having the oxide film 12b, the contact resistance between the active layer 11 and the source and drain electrodes 16 increases. Therefore, contact hole 17 may be formed in the oxide film 12b in addition to gate insulating film 13 and interlayer insulating layer 15.

Figure 3:
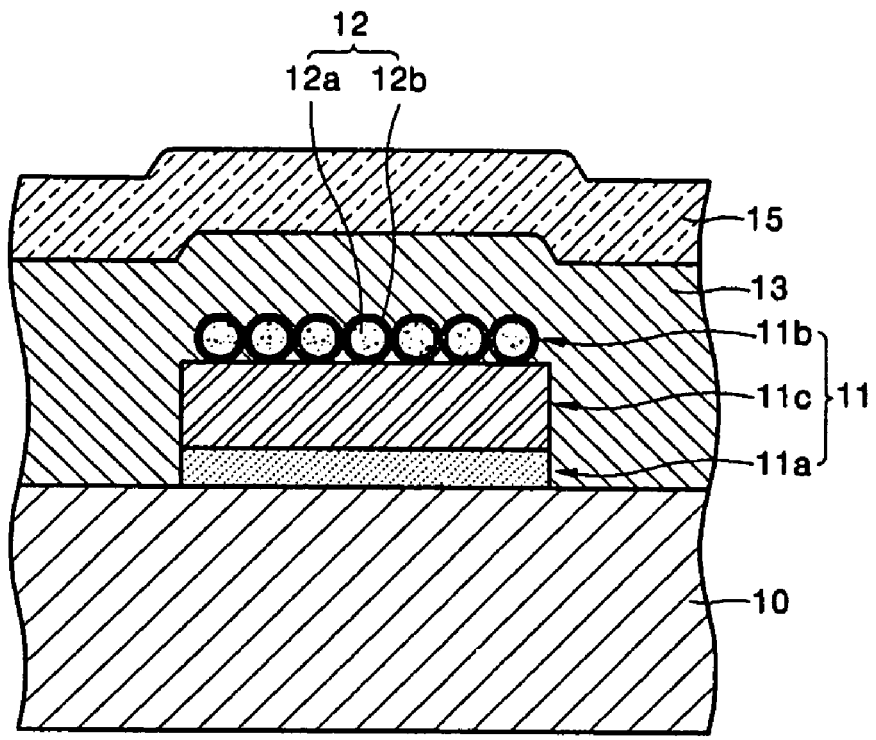
FIG. 3, FIG. 4, and FIG. 5 are cross-sectional views taken along a line I-I of FIG. 1 illustrating a method for manufacturing the TFT of FIG. 1.
Figure 4:
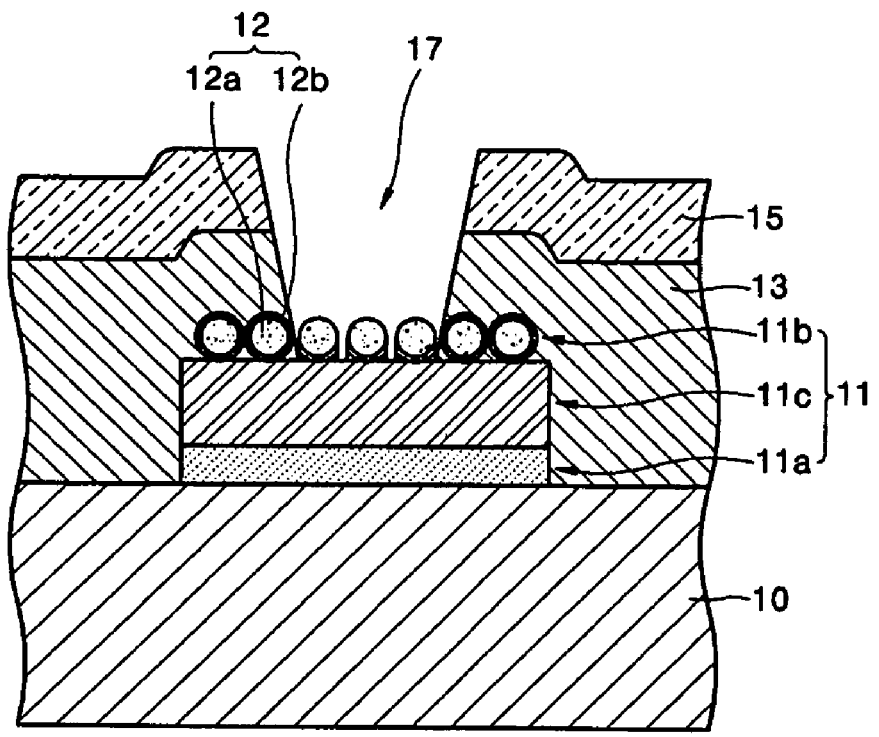
Figure 5:
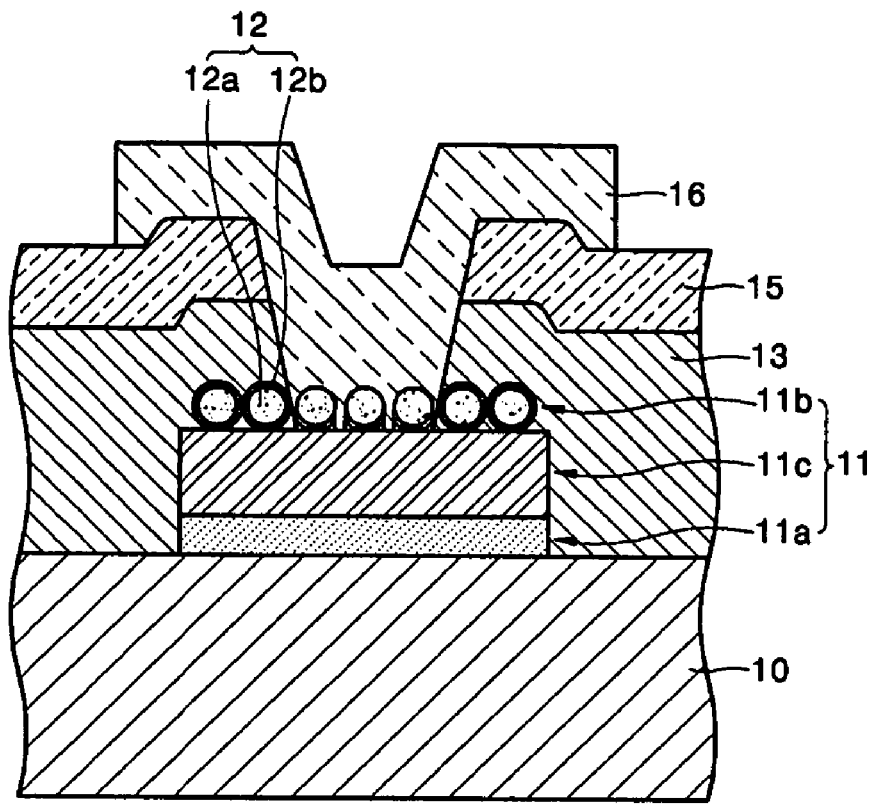

FIG. 3, FIG. 4, and FIG. 5, the second nano particle layer 11b of active layer 11 depicted in FIG. 2 is shown in detail.

As shown in FIG. 3, active layer 11 formed of nano particles 12 may be formed on substrate 10. Gate insulating film 13 and an interlayer insulating layer 15 can be formed to cover active layer 11. As described above, active layer 11 may be formed by patterning first nano particle layer 11a, insulating layer 11c, and second nano particle layer 11b. Gate electrode 14 (see FIG. 1) may be interposed between gate insulating film 13 and interlayer insulating layer 15.

Looking at FIG. 4, a contact hole 17 may be formed by etching gate insulating film 13 and interlayer insulating layer 15 until oxide film 12b is etched.

Oxide film 12b can be separately etched by using a dry etching method or Buffered Oxide Etching (BOE) after gate insulating film 13 and interlayer insulating layer 15 are etched, but the invention is not limited thereto. That is, oxide film 12b, gate insulating film 13, and interlayer insulating layer 15 can be simultaneously etched.

In contact hole 17, core unit 12a is exposed and oxide film 12b remain on a bottom surface of nano particles 12 in second nano particle layer 11. Any shape of the contact hole 17 can be implemented as long as it exposes at least a portion of the core unit 12a of nano particles 12 in second nano particle layer 11b.

As shown in FIG. 5, source and drain electrodes 16 are formed in contact hole 17 and on interlayer insulating layer 15. The contact resistance between source and drain electrodes 16 and active layer 11 can be reduced significantly since the source and drain electrodes 16 can directly contact core units 12a of nano particles 12 in second nano particle layer 11b.

At this time, first nano particle layer 11a and second nano particle layer 11b are insulated from each other by oxide films 12b and insulating layer 11c.

Figure 6:
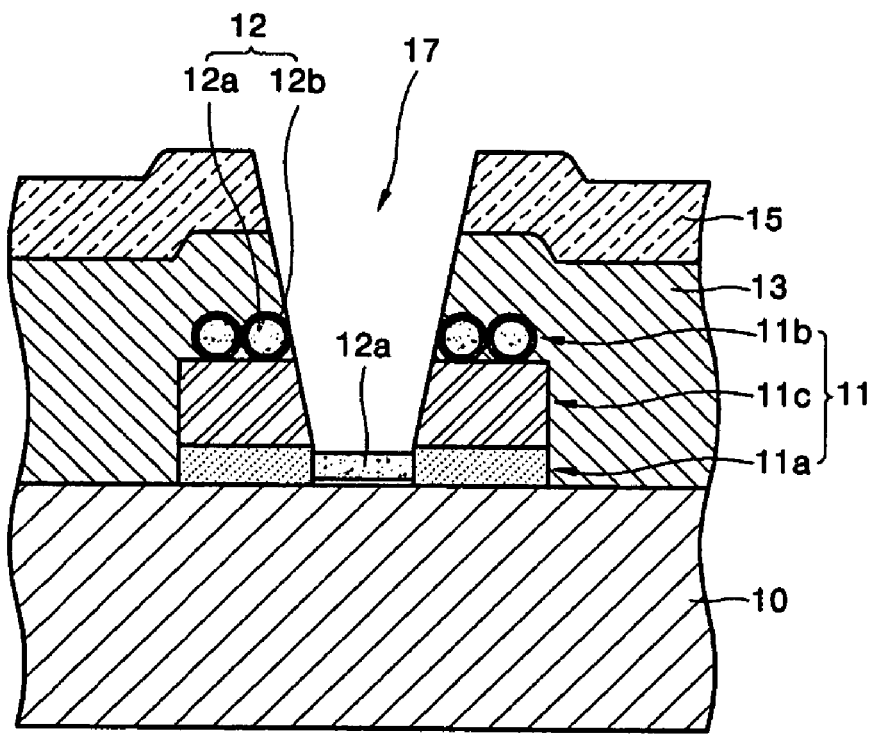
FIG. 6 and FIG. 7 are cross-sectional views taken along a line I-I of FIG. 1 for illustrating another method for manufacturing the TFT of FIG. 1.
Figure 7:
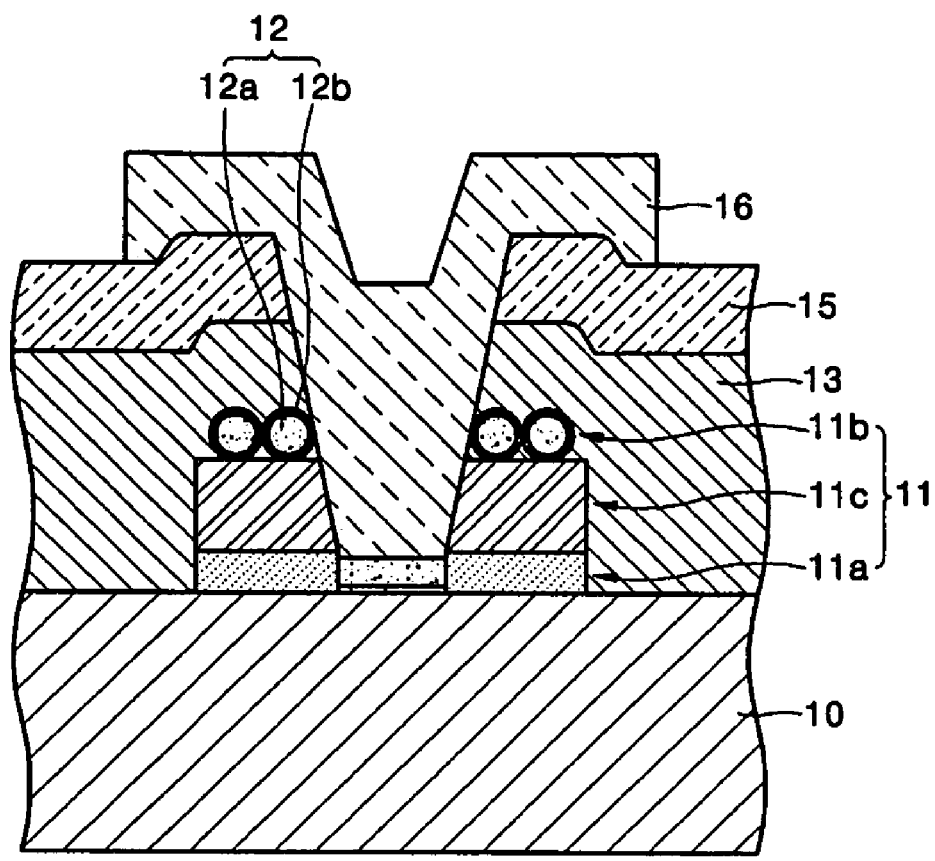

In contrast, looking at FIG. 6, contact hole 17 is formed to expose the core units 12a of the first nano particle layer 11a, and the source and drain electrodes 16 are then formed, as shown in FIG. 7.

According to an embodiment of the present invention, the mobility of active layer 11 can be controlled because active layer 11 can be formed having a variety of arrangements for nano particles 12 in both first nano particle layer 11a and second nano particle layer 11b.

Two examples of the mobility of the channel will be provided. In the first example, as shown in FIG. 5, after disposing first nano particle layer 11a perpendicularly to the second nano particle layer 11b to form active layer 11, a channel may be formed in second nano particle layer 11b parallel to the longitudinal direction of nano particles 12 in second nano particle layer 11b. In the second example, as shown in FIG. 7, the channel is formed in first nano particle layer 11a. The first example exhibits higher mobility than the second example because the channel direction is parallel to the longitudinal axis of the nano particles. Therefore, a TFT with a desired mobility can be obtained without performing an additional fabrication process.

On the other hand, when implementing a CMOS TFT, first nano particle layer 11a is formed of P-type nano particles and second nano particle layer 11b is formed of N-type nano particles. The CMOS TFT can be obtained by using a TFT in which a channel is formed in first nano particle layer 11a as a P-type TFT and another TFT in which the channel is formed in second nano particle layer 11b as an N-type TFT.

Figure 8:
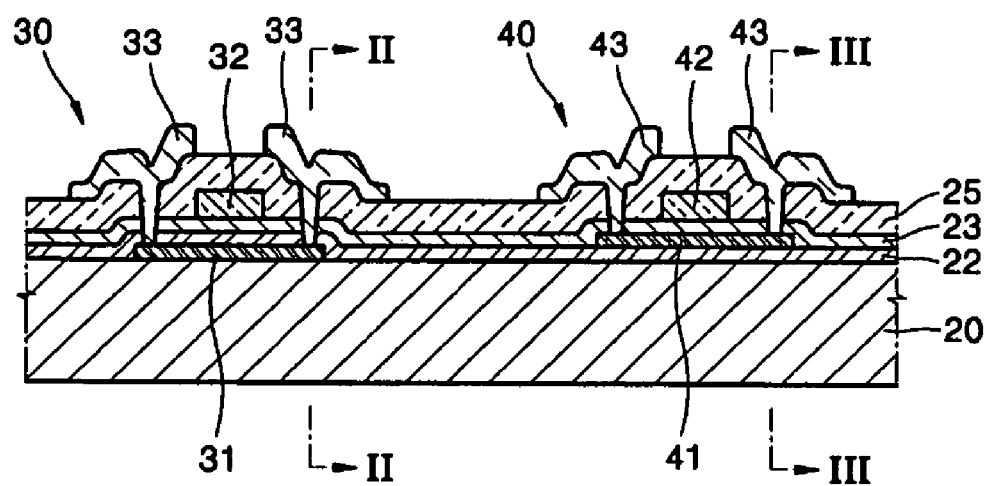
FIG. 8 is a cross-sectional view illustrating a structure of a TFT according to another embodiment of the present invention.
Figure 9:
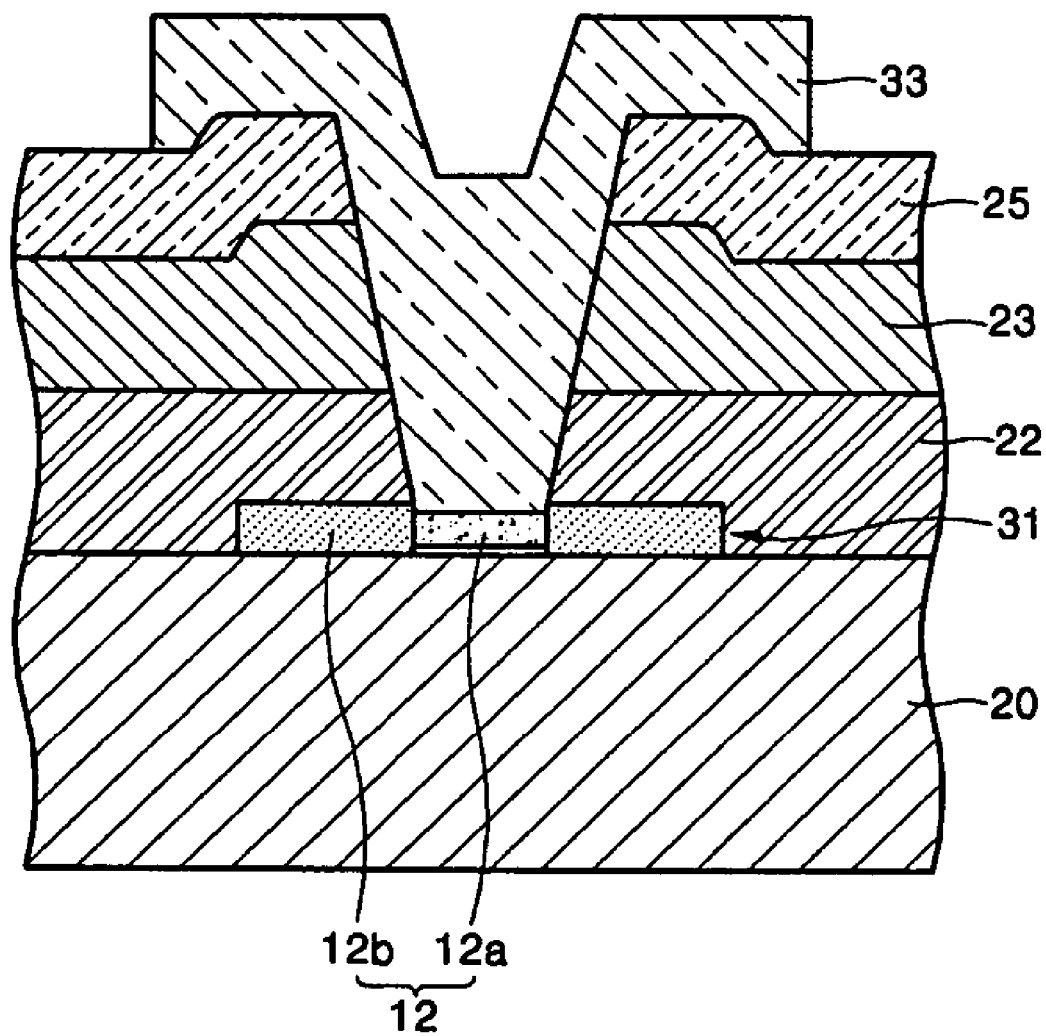
FIG. 9 is a cross-sectional view taken along line II-II of FIG. 8.
Figure 10:
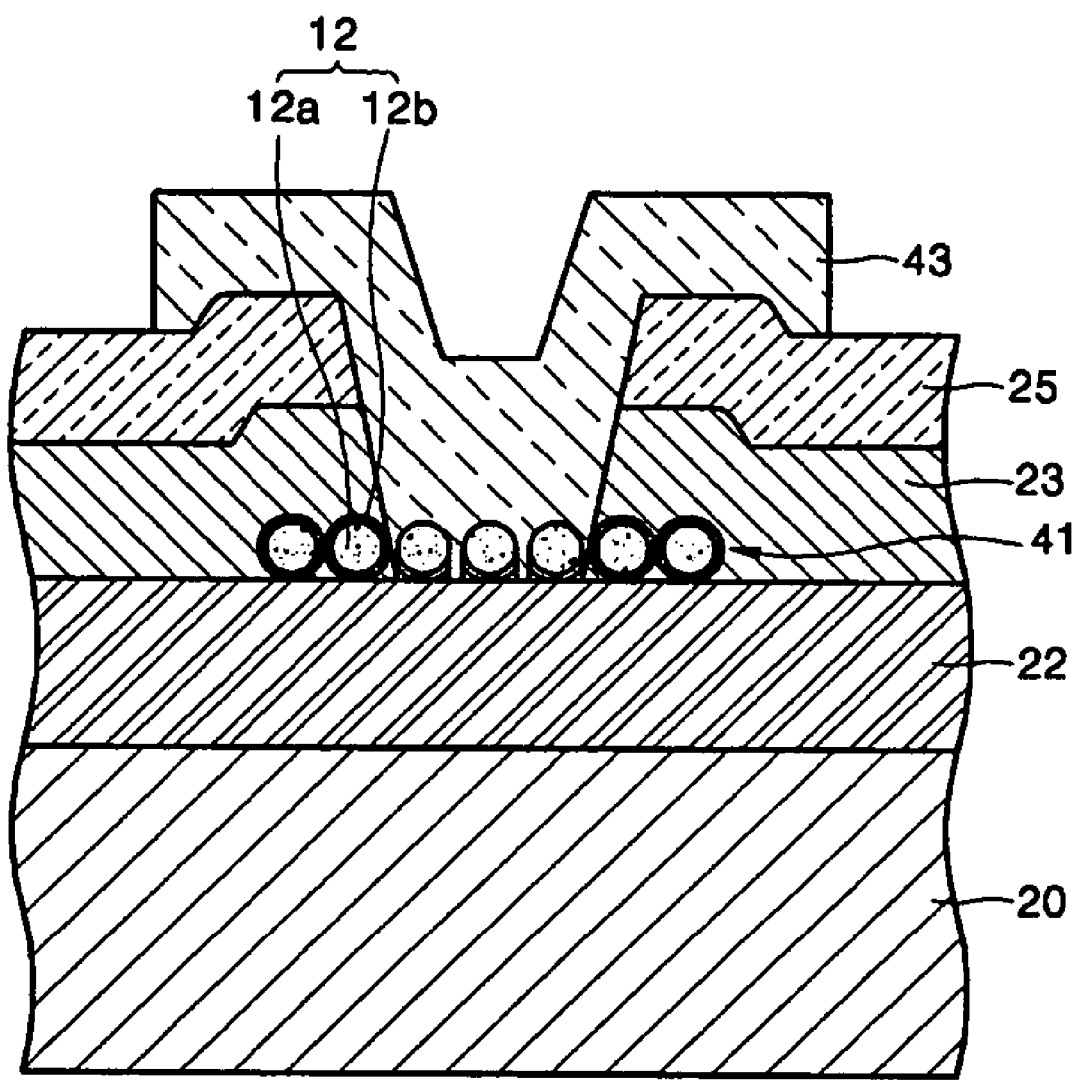
FIG. 10 is a cross-sectional view taken along line III-III of FIG. 8.

In the TFTs depicted in FIG. 8, FIG. 9 and FIG. 10, an active layer includes a single nano particle layer.

A first TFT 30 and a second TFT 40 are disposed on substrate 20. First and second TFTs 30 and 40 can be different kinds of TFTs but they can be electrically connected to each other. First and second TFTs 30 and 40 can also be separated.

First and second TFTs 30 and 40 respectively may include active layers 31 and 41, gate electrodes 32 and 42, and source and drain electrodes 33 and 43. But first and second TFTs can have a variety of structures.

Active layers 31 and 41 may each include a single nano particle layer or multiple nano particle layers including nano particles 12. An insulating layer 22 is interposed between active layers 31 and 41.

Nano particles 12 of active layers 31 and 41 can be disposed perpendicularly to each other, as shown in FIG. 2, or can be disposed parallel to each other.

Active layer 31 can be a P-type nano particle layer composed of P-type nano particles, and active layer 41 can be an N-type nano particle layer composed of N-type nano particles or, vice versa, active layer 31 can be an N-type nano particle layer and active layer 41 can be a P-type nano particle layer.

In order to obtain the desired TFT structure, an insulating layer covering the patterned active layer is formed and the other active layer is patterned using a different method from the method of forming the first active layer. The nano particle layers that form active layers 31 and 41 can be formed using a variety of methods, such as a stamping method using a polymer mold, a laser transcription method, or an ink-jet printing method.

As described above, nano particles 12 in the active layers 31 and 41 may include a core unit 12a and surrounding oxide film 12b even if active layers 31 and 41 are formed as different layers on substrate 20.

Therefore, referring to FIG. 9 and FIG. 10, source and drain electrodes 33 and 43 can contact the core units 12a in each of active layers 31 and 41.

The TFT depicted in FIG. 8 can be a CMOS TFT using first TFT 30 as a P-type TFT and second TFT 40 as an N-type TFT, or first TFT 30 can be the N-type TFT and second TFT 40 can be the P-type TFT. This TFT structure can be applied to a flat display device, such as an OELD display device.

Figure 11:
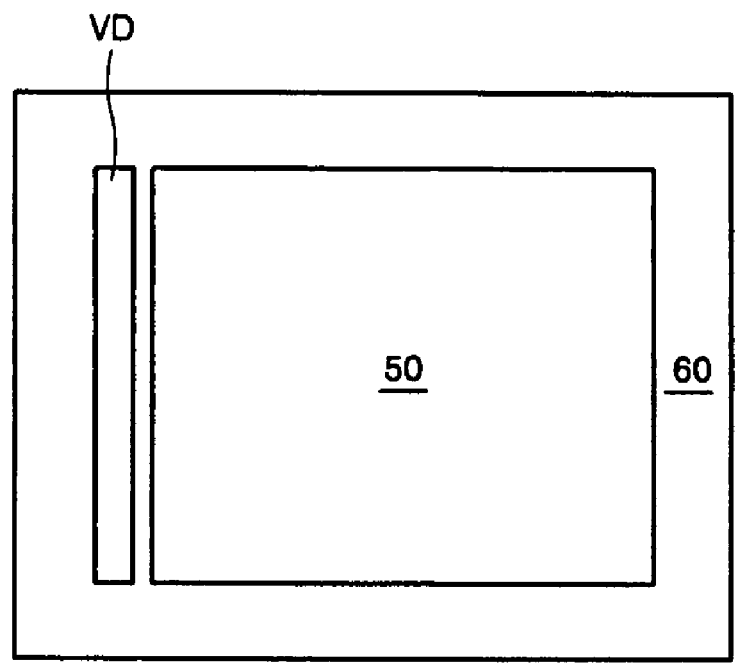
FIG. 11 is a plan view illustrating a plain structure of a flat display device according to an embodiment of the present invention.

Referring to FIG. 11, a plurality of sub-pixels having an OELD device and a selection driving circuit are disposed in emissive region 50.

A horizontal driver and/or a vertical driver that drives the sub-pixels is disposed in non-emissive region 60. In FIG. 11, only a vertical driver VD is depicted, but the present invention is not limited thereto, and a plurality of circuits, such as a horizontal driver or a level shifter, can be disposed in non-emissive region 60. Non-emissive region 60 also includes a terminal unit connected to an external circuit and a sealing unit that seals at least emissive region 50.

Figure 12:
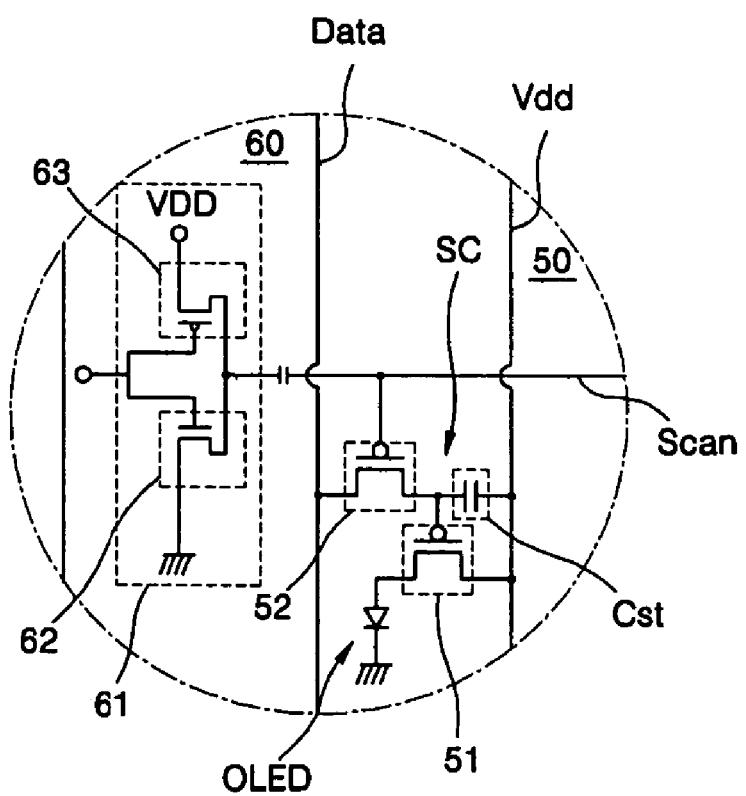
FIG. 12 is a circuit diagram illustrating a circuit structure of an emissive region and a non-emissive region.

FIG. 12 is a circuit diagram illustrating a selection driving circuit SC of a unit pixel in emissive region 50 and a CMOS TFT 61 of vertical driver VD in non-emissive region 60. The circuit is not limited to that shown in FIG. 12, and to a variety of circuit structures can be implemented.

Figure 13:
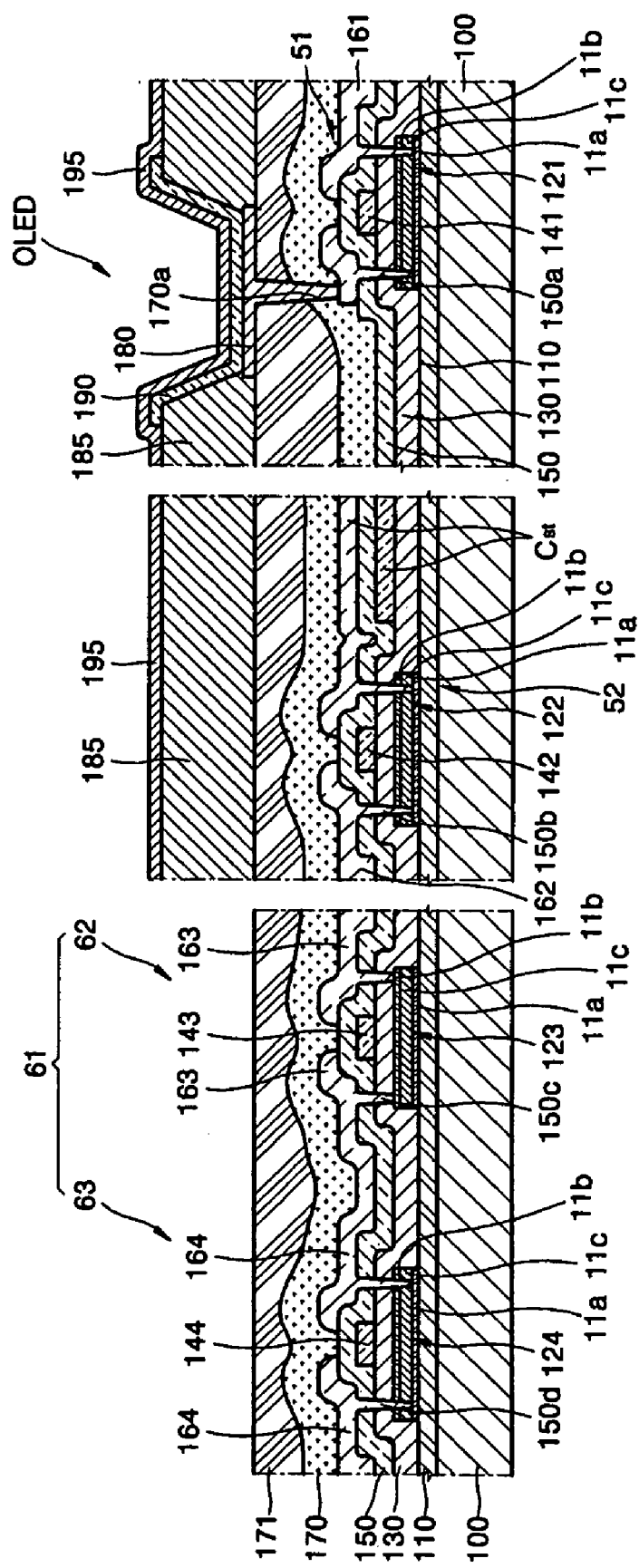
FIG. 13 is a cross-sectional view illustrating a structure of the emissive region and the non-emissive region of FIG. 12.

FIG. 13 illustrates a driving TFT 51 and a switching TFT 52 of the selection driving circuit SC in one of the unit pixels and a CMOS TFT 61 of the vertical driver VD. CMOS TFT 61 includes a P-type TFT 63 and an N-type TFT 62 in a coupled state. Vertical driver VD includes the CMOS TFT 61 and a plurality of TFTs and circuit devices.

TFTs 51, 52, 62, and 63 are formed on a substrate 100, which is similar to substrate 10 shown in FIG. 1. If necessary, a buffer layer 110 may be formed on substrate 100 for preventing the diffusion of dopant ions and a barrier layer may be formed if substrate 100 is made of plastic.

First and second nano particle layers 11a and 11b are formed on substrate 100. First nano particle layer 11a may be formed of P-type nano particles and second nano particle layer 11b may be formed of N-type nano particles. An insulating layer 11c can be interposed between first and second nano particles layers 11a and 11b, to thereby form a plurality of active layers 121, 122, 123, and 124.

Figure 14:
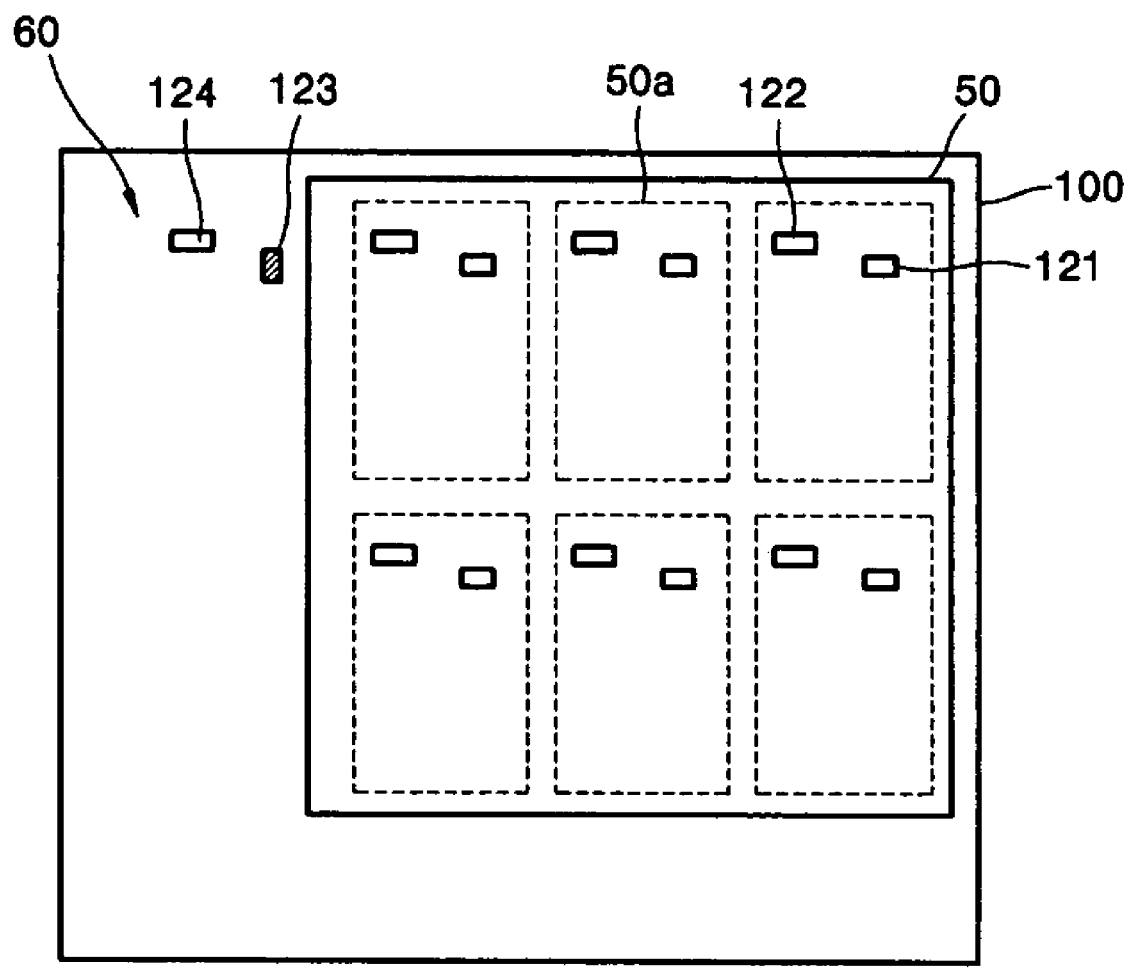
FIG. 14 is a plan view of an active layer of a flat display device according to an embodiment of the present invention.

After forming first nano particle layer 11a, insulating layer 11c, and second nano particle layer 11b on the entire surface of substrate 100, channels are formed by patterning of semiconductor active layers 121, 122, 123, and 124 as shown in FIG. 14.

A channel can be formed in first nano particle layer 11a that is formed of P-type nano particles because active layers 121 and 122 included in unit pixels 50a in emissive region 50 can be P-type active layers. In the case of a CMOS TFT, a channel may be formed in second nano particle layer 11b of N-type active layer 123 that is formed of N-type nano particles in and a channel may be formed in first nano particle layer 11a of P-type active layer in 124 that is formed of P-type nano particles.

Both of the channels of active layers 121 and 122 included in unit pixel 50a can be formed in second nano particle layer 11b or the channel of one of active layers 121 and 122 can be formed in second nano particle layer 11b and the other channel can be formed in first nano particle layer 11a. Also, when the number of the active layers included in the unit pixel 50a is increased, the P-type nano particle layer and the N-type nano particle layer can be mixed.

Also, as described above, the active layers 121 and 122 can be patterned in consideration of the arrangement of the nano particles in each of the nano particle layers and the directions of the channels. Active layers 121, 122, 123, and 124 of the respective TFTs 51, 52, 62, and 63 can be formed as shown in FIG. 15.

Active layer 121 of P-type driving TFT 51, active layer 122 of switching TFT 52, and active layer 124 of P-type TFT 63 of CMOS TFT 61 are formed on buffer 110. After forming an insulating layer 120 on the active layers 121, 122, and 124, the active layer 123 of N-type TFT 62 of CMOS TFT 61 is then formed on insulating layer 120.

Figure 15:
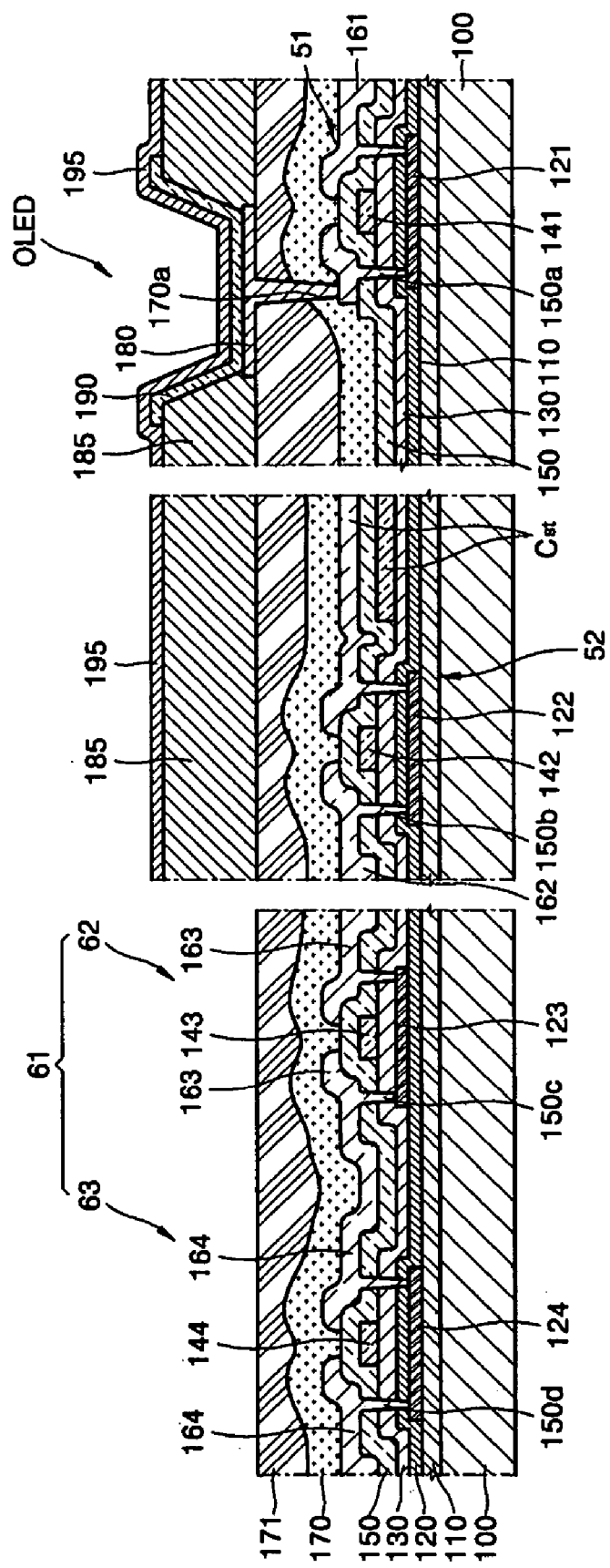
FIG. 15 is cross-sectional view illustrating an alternative structure of the emissive region and the non-emissive region of FIG. 12.

Referring to FIG. 13 and FIG. 15, a gate insulating film 130 is formed on patterned active layers 121, 122, 123, and 124, and gate electrodes 141, 142, 143, and 144, can be formed of a conductive metal on gate insulating film 130.

An interlayer insulating layer 150 is formed on gate insulating film 130 and gate electrodes 141, 142, 143, and 144. Source and drain electrodes 161, 162, 163, and 164 of are insulated from gate electrodes 141, 142, 143, and 144, respectively, and are disposed on interlayer insulating layer 150. Source and drain electrodes 161, 162, 163, and 164 are formed of a conductive material, such as a conductive metal film or a conductive polymer. Also, source and drain electrodes 161, 162, 163, and 164 contact active layers 121, 122, 123, and 124 through contact holes 150a, 150b, 150c, and 150d, respectively. In the case of N-type TFT 62 shown in FIG. 13, contact hole 150c extends to core units of second nano particle layer 11b, which is formed of N-type nano particles, and in the case of the P-type TFT 63, contact hole 150d extends to core units of the first nano particle layer 11a, which is formed of P-type nano particles. TFTs 51 and 52 disposed in the emissive region 50 have contact holes 150a and 150b that extend to the core units of first nano particle layer 11a.

A capacitor Cst can be formed when forming gate electrodes 141, 142, 143, and 144 and source and drain electrodes 161, 162, 163, and 164 using identical materials.

A passivation film 170 may be formed on source and drain electrodes 161, 162, 163, and 164, and a planarizing film 171 can be formed of acryl, benzo-cyclo-butene (BCB), or polyimide on the passivation film 170. A via hole 170a exposing one of the source or drain electrodes 161 of driving TFT 51 is formed in passivation film 170 and planarizing film 171. Passivation film 170 and planarizing film 171 are not necessarily limited to the described arrangement, as driving TFT 51 may include one of either passivation film 170 or planarizing film 171.

A pixel electrode 180, which is a lower electrode layer of an [organic light emitting diode] (OLED), is formed on planarizing film 171. Pixel electrode 180 is connected to one of the source or drain electrodes 161 through via hole 170a.

A pixel defining film 185 is formed on pixel electrode 180 from an insulating material that either can be organic, like acryl, BCB, polyimide, or can be inorganic, like silicon oxide or silicon nitride. As shown in FIG. 12, pixel defining film 185 is formed to cover driving TFT 51 of the selection driving circuit SC and switching TFT 52 and has an opening exposing a predetermined portion of pixel defining electrode 185.

An organic film 190 having an emissive layer is coated on at least the opening through which pixel electrode 180 is exposed. Organic film 190 can be formed on the entire surface of pixel defining electrode 185. The emissive layer of organic film 190 can produce all colors by being patterned to red, green, and blue in each of the pixels.

Pixel defining film 185 can be formed to cover the vertical or horizontal driver, however, referring to FIG. 13 and FIG. 15, pixel defining film 185 need not be formed on a location on which the vertical or horizontal driver of non-emissive region 60 is disposed.

After forming organic film 190, a facing electrode 195, which is a lower electrode layer of an OLED, is formed. Facing electrode 195 covering all of the pixels or some of the pixels can be formed, or can be patterned.

Pixel electrode 180 and facing electrode 195 are insulated from each other by organic film 190 and light is emitted from organic film 190 by applying voltages of differing polarities.

Pixel electrode 180 functions as an anode and facing electrode 195 functions as a cathode. The polarities of pixel electrode 180 and facing electrode 195 can be changed.

Pixel electrode 180 can be a transparent electrode or a reflective electrode. When the pixel electrode 180 is a transparent electrode, pixel electrode 180 can be made of ITO, IZO, ZnO, or $In_2O_3$. When pixel electrode 180 is a reflective electrode, a reflective film that can be made of Ag, Mg, Al, Pt, Pd, Au, Ni, Nd, Ir, Cr, or a compound of these metals is formed on a transparent electrode.

Facing electrode 195 can also be a transparent electrode or a reflective electrode. When the facing electrode 195 is a transparent electrode, an auxiliary electrode layer or a bus electrode line can be formed on the facing electrode 195 using a material for forming a transparent electrode listed above. When facing electrode 195 is a reflective electrode, the facing electrode 195 can be formed by depositing a metal having a small work function, such as Li, Ca, LiF/Ca, LiF/Al, Al, Mg, or a compound of these metals because facing electrode 195 is being used as a cathode.

Organic film 190 can be a low molecular weight or polymer organic layer. The low molecular weight organic layer may be a Hole Injection Layer (HIL), a Hole Transport Layer (HTL), an Emission Layer (EML), an Electron Transport Layer (ETL), an Electron Injection Layer (EIL) or a combinarion of these and can be composed of copper phthalocyanine (CuPc), N,N'-Di(naphthalene-1-yl)-N,N'-diphenyl-benzidine (NPB), or tris-8-hydroxyquinoline aluminum ($Alq_3$). The low molecule organic layer can be formed using an evaporation method.

If organic film 190 is formed of a polymer organic layer, the organic film 190 can be an HTL and an EML, and the HTL can be formed of PEDOT and the EML can be formed of Poly-Phenylenevinylene (PPV) or Polyfluorene. The polymer organic layer can be formed using various methods including a screen printing method or an ink jet printing method.

This structure can also be used for liquid crystal display devices. Also, in the above embodiments, driving TFT 51 of the selection driving circuit SC and switching TFT 52 have been described as P-type TFTs, but the present invention is not limited thereto, and at least one of driving TFT 51 and switching TFT 52 can be an N-type TFT.

The present invention provides simplified processes for forming different kinds of TFTs and their designs can be widely varied since the TFTs of the emissive and non-emissive regions can be adapted for desired mobility characteristics. Further, either a P-type TFT or an N-type TFT can be easily formed, which in turn facilitates the production of a CMOS TFT.

While the present invention has been particularly shown and described with reference to the disclosed embodiments, it will be understood by those of ordinary skill in the art that various changes in form and details may be made therein without departing from the spirit and scope of the present invention as defined by the appended claims.

What is claimed is:

1. A thin film transistor (TFT), comprising:
    an active layer comprising a first nano particle layer including at least one first nano particle and a second nano particle layer including at least one second nano particle, which is different from the first nano particle, and an insulating layer interposed between the first nano particle layer and the second nano particle layer;
    a gate electrode insulated from the active layer; and
    wherein the first nano particle layer, the insulating layer, and the second nano particle layer are stacked sequentially and have the same pattern, and
    wherein source and drain electrodes contact only one of the first nano particle layer and the second nano particle layer, and the other of the first nano particle layer and the second nano particle layer does not contact a source electrode or a drain electrode.

2. The TFT of claim 1, wherein the first nano particle layer is a P-type nano particle layer and the first nano particle is a P-type nano particle, and
    wherein the second nano particle layer is an N-type nano particle layer and the second nano particle is an N-type nano particle.

3. The TFT of claim 1, wherein a longitudinal axis of the first nano particle of the first nano particle layer extends in a different direction than a longitudinal axis of the second nano particle of the second nano particle layer.

4. The TFT of claim 1, wherein longitudinal axes of the first and second nano particles of the first and second nano particle layers extend in the same direction.

5. The TFT of claim 1, wherein the TFT is a complementary metal-oxide semiconductor (CMOS) TFT comprising a P-type TFT and an N-type TFT,
    wherein the first nano particle layer is a P-type nano particle layer and the first nano particle is a P-type nano particle,
    wherein the second nano particle layer is an N-type nano particle layer and the second nano particle is a N-type nano particle,
    wherein the P-type TFT comprises a P-type active layer having the first nano particle layer and the second nano particle layer insulated from each other, and source and drain electrodes contacting only the first nano particle layer of the P-type active layer; and
    wherein the N-type TFT comprises an N-type active layer having the first nano particle layer and the second nano particle layer insulated from each other, and source and drain electrodes contacting only the second nano particle layer of the N-type active layer.

6. The TFT of claim 1, wherein the first and second nano particles are selected from a group consisting of: a nano wire, a nano rod, and a nano ribbon.

7. The TFT of claim 1, wherein at least two nano particles are included in each nano particle layer and the nano particles of each nano particle layer are arranged parallel to each other.

8. The TFT of claim 1, wherein the at least one nano particle includes a core unit and an oxide film covering the core unit, and the source and drain electrodes contact the core unit of the at least one nano particle.

9. An electronic device including at least two different types of TFTs electrically connected to each other, each of the TFTs comprising:
    an active layer comprising a first nano particle layer including at least one first nano particle and a second nano particle layer including at least one second nano particle, which is different from the first nano particle, and an insulating layer interposed between the first nano particle layer and the second nano particle layer;
    a gate electrode insulated from the active layer; and
    wherein the first nano particle layer, the insulating layer, and the second nano particle layer are stacked sequentially and have the same pattern, and
    wherein source and drain electrodes contact only one of the first nano particle layer and the second nano particle layer, and the other of the first nano particle layer and the second nano particle layer does not contact a source electrode or a drain electrode.

10. The electronic device of claim 9, wherein the at least two TFTs include a P-type TFT and an N-type TFT.

11. The electronic device of claim 9, wherein the first and second nano particles are selected from a group consisting of: a nano wire, a nano rod, and a nano ribbon.

12. The electronic device of claim 9, wherein at least two nano particles are included in each nano particle layer and the nano particles arranged parallel to each other.

13. The electronic device of claim 9, wherein the at least one nano particle includes a core unit and an oxide film covering the core unit, and the source and drain electrodes contact the core unit of the at least one nano particle.

14. A flat display device, comprising:
    a substrate; and
    an emissive region having a plurality of pixels disposed on the substrate, each pixel including a plurality of selection driving circuits,
    wherein each of the selection driving circuit includes at least one TFT comprising:
    an active layer comprising a first nano particle layer including at least one first nano particle and a second nano particle layer including at least one second nano particle, which is different from the first nano particle, and an insulating layer interposed between the first nano particle layer and the second nano particle layer;
    a gate electrode insulated from the active layer; and
    wherein the first nano particle layer, the insulating layer, and the second nano particle layer are stacked sequentially and have the same pattern, and
    wherein source and drain electrodes contact only one of the first nano particle layer and the second nano particle layer, and the other of the first nano particle layer and the second nano particle layer does not contact a source electrode or a drain electrode.

15. The flat display device of claim 14, wherein the first nano particle layer is a P-type nano particle layer and the first nano particle is a P-type nano particle, and
    wherein the second nano particle layer is an N-type nano particle layer and the second nano particle is an N-type nano particle.

16. The flat display device of claim 14, further comprising a CMOS TFT which is electrically connected to at least one selection driving circuits, the CMOS comprising a P-type TFT and an N-type TFT, wherein the first nano particle layer is a P-type nano particle layer and the first nano particle is a P-type nano particle, and the second nano particle layer is an N-type nano particle layer and the second nano particle is an N-type nano particle, wherein the P-type TFT includes a P-type active layer that has the first nano particle layer and the second nano particle layer insulated from each other, and source and drain electrodes contacting only the first nano particle layer of the P-type active layer; and wherein the N-type TFT includes an N-type active layer that has the first nano particle layer and the second nano particle layer insulated from each other, and source and drain electrodes contacting only the second nano particle layer of the N-type active layer.

17. The flat display device of claim 14, wherein each of the selection driving circuits includes at least two different types of TFTs, and the nano particle layers of two different types of TFTs that contact the source and drain electrodes are disposed on different layers.

18. The flat display device of claim 17, wherein the at least two TFTs of each of the selection driving circuits include a P-type TFT and an N-type TFT.

19. The flat display device of claim 14, wherein a longitudinal axis of the at least one nano particle of one nano particle layer extends in a different direction than a longitudinal axis of the at least one nano particle of another nano particle layer.

20. The flat display device of claim 14, wherein longitudinal axes of the nano particles of the at least two nano particle layers extend in the same direction.

21. The flat display device of claim 14, wherein the at least one nano particle is selected from a group consisting of: a nano wire, a nano rod, and a nano ribbon.

22. The flat display device of claim 14, wherein at least two nano particles are included in each nano particle layer and the nano particles of each nano particle layer are arranged parallel to each other.

23. The flat display device of claim 14, wherein longitudinal axes of the channels are parallel to a longitudinal axis of the at least one nano particle of the nano particle layer contacting the source and drain electrodes.

24. The flat display device of claim 14, wherein the at least one nano particle includes a core unit and an oxide film covering the core unit, and the source and drain electrodes contact the core unit of the at least one nano particle.

25. The flat display device of claim 14, wherein each pixel includes an organic light emitting diode (OLED) electrically connected to the selection driving circuit.

26. A flat display device, comprising:
a substrate; and
an emissive region having a plurality of pixels disposed on the substrate, each pixel including a plurality of selection driving circuits,
wherein each of the selection driving circuits include at least two different types of TFTs, each of the TFTs of the selection driving circuit comprise:
an active layer comprising a first nano particle layer including at least one first nano particle and a second nano particle layer including at least one second nano particle, which is different from the first nano particle, and an insulating layer interposed between the first nano particle layer and the second nano particle layer;
a gate electrode insulated from the active layer; and
wherein the first nano particle layer, the insulating layer, and the second nano particle layer are stacked sequentially and have the same pattern, and
wherein source and drain electrodes contact only one of the first nano particle layer and the second nano particle layer, and the other of the first nano particle layer and the second nano particle layer does not contact a source electrode or a drain electrode.

27. The flat display device of claim 26, wherein longitudinal axes of the channels of the different types of TFTs for each of the selection driving circuits extend in different directions.

28. The flat display device of claim 26, further comprising a CMOS TFT electrically connected to at least one selection driving circuit, the CMOS TFT comprising a P-type TFT and an N-type TFT, wherein the first nano particle layer is a P-type nano particle layer and the first nano particle is a P-type nano particle, and the second nano particle layer is an N-type nano particle layer and the second nano particle is an N-type nano particle, wherein the P-type TFT comprises a P-type active layer having the first nano particle layer and the second nano particle layer insulated from each other, and source and drain electrodes contacting only the first nano particle layer of the P-type active layer, and wherein the N-type TFT comprises an N-type active layer having the first nano particle layer and the second nano particle layer insulated from each other, and source and drain electrodes contacting only the second nano particle layer of the N-type active layer.

29. The flat display device of claim 26, wherein longitudinal axes of the nano particles of the different types of TFTs extend in different directions.

30. The flat display device of claim 26, wherein longitudinal axes of the nano particles for the different types of TFTs extend in the same direction.

31. The flat display device of claim 26, wherein the at least one nano particle is selected from a group consisting of: a nano wire, a nano rod, and a nano ribbon.

32. The flat display device of claim 26, wherein at least two nano particles are included in each nano particle layer and the nano particles are arranged parallel to each other.

33. The flat display device of claim 26, wherein longitudinal axes of the channels are parallel to a longitudinal axis of the at least one nano particle of the nano particle layer contacting the source and drain electrodes.

34. The flat display device of claim 26, wherein the at least one nano particle includes a core unit and an oxide film covering the core unit, and the source and drain electrodes contact the core unit of the at least one nano particle.

35. The flat display device of claim 26, wherein each pixel includes an OLED electrically connected to the selection driving circuit.

* * * * *

UNITED STATES PATENT AND TRADEMARK OFFICE
CERTIFICATE OF CORRECTION

PATENT NO. : 7,579,653 B2                Page 1 of 1
APPLICATION NO. : 11/184829
DATED : August 25, 2009
INVENTOR(S) : Suh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 599 days.

Signed and Sealed this

Fourteenth Day of September, 2010

David J. Kappos
*Director of the United States Patent and Trademark Office*